United States Patent
Hanaoka

(10) Patent No.: US 10,008,757 B2
(45) Date of Patent: Jun. 26, 2018

(54) HIGH-FREQUENCY MODULE

(71) Applicant: Murata Manufacturing Co., Ltd., Nagaokakyo-shi, Kyoto-fu (JP)

(72) Inventor: Kunitoshi Hanaoka, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 2 days.

(21) Appl. No.: 15/394,868

(22) Filed: Dec. 30, 2016

(65) Prior Publication Data

US 2017/0110779 A1 Apr. 20, 2017

Related U.S. Application Data

(63) Continuation of application No. PCT/JP2015/069837, filed on Jul. 10, 2015.

(30) Foreign Application Priority Data

Jul. 10, 2014 (JP) ................. 2014-142121

(51) Int. Cl.
*H01P 1/00* (2006.01)
*H01P 5/18* (2006.01)
(Continued)

(52) U.S. Cl.
CPC ............. *H01P 5/18* (2013.01); *H01P 5/184* (2013.01); *H01P 5/187* (2013.01); *H02M 1/00* (2013.01);
(Continued)

(58) Field of Classification Search
CPC . H01P 5/18; H01P 5/184; H01P 5/187; H03H 7/38; H05K 1/0243
(Continued)

(56) References Cited

U.S. PATENT DOCUMENTS

| 5,487,184 A | 1/1996 | Nagode |
| 6,928,298 B2 * | 8/2005 | Furutani ................ H03H 7/463 |
| | | 455/553.1 |

(Continued)

FOREIGN PATENT DOCUMENTS

| JP | 08-505750 A | 6/1996 |
| JP | 2000-165116 A | 6/2000 |

(Continued)

OTHER PUBLICATIONS

Official Communication issued in corresponding International Application PCT/JP2015/069837, dated Oct. 6, 2015.

*Primary Examiner* — Sonny Trinh
(74) *Attorney, Agent, or Firm* — Keating & Bennett, LLP

(57) ABSTRACT

An inductor component is disposed outside a multilayer substrate, and thus a directional coupler defined by an internal wiring electrode and a coil electrode within the inductor component that is mounted on a pair of land electrodes, the multilayer substrate significantly reduces or prevents interference with other high-frequency circuit elements disposed in or on the multilayer substrate. Additionally, if a plurality of inductor components having different inductor characteristics are prepared, a high-frequency module including the multilayer substrate capable of defining the directional coupler whose characteristics are able to adjusted with ease is able to be provided simply by selecting the desired inductor component from the inductor components and replacing that inductor component.

20 Claims, 5 Drawing Sheets

(51) Int. Cl.
*H03H 7/38* (2006.01)
*H04B 1/04* (2006.01)
*H05K 1/02* (2006.01)
*H05K 1/11* (2006.01)
*H05K 1/18* (2006.01)
*H02M 1/00* (2006.01)

(52) U.S. Cl.
CPC ............ *H03H 7/38* (2013.01); *H04B 1/04* (2013.01); *H05K 1/0243* (2013.01); *H05K 1/115* (2013.01); *H05K 1/181* (2013.01); *H05K 2201/09772* (2013.01); *H05K 2201/1003* (2013.01)

(58) Field of Classification Search
USPC .............. 455/78, 63.1, 67.13, 82, 83, 552.1; 333/1.1, 247
See application file for complete search history.

(56) References Cited

U.S. PATENT DOCUMENTS

| | | | | |
|---|---|---|---|---|
| 7,250,829 | B2* | 7/2007 | Namura | H01P 1/15 |
| | | | | 333/101 |
| 8,326,344 | B2* | 12/2012 | Kemmochi | H04B 1/44 |
| | | | | 257/728 |
| 9,300,019 | B2* | 3/2016 | Ono | H05K 1/0225 |
| 9,433,080 | B2* | 8/2016 | Suzuki | H01L 23/552 |
| 9,451,690 | B2* | 9/2016 | Saji | H05K 1/0243 |
| 9,467,198 | B2* | 10/2016 | Uejima | H04B 1/0057 |

FOREIGN PATENT DOCUMENTS

| | | |
|---|---|---|
| JP | 2006-191221 A | 7/2006 |
| JP | 2012-244324 A | 12/2012 |

* cited by examiner

HIGH-FREQUENCY MODULE

CROSS REFERENCE TO RELATED APPLICATIONS

This application claims the benefit of priority to Japanese Patent Application No. 2014-142121 filed on Jul. 10, 2014 and is a Continuation application of PCT Application No. PCT/JP2015/069837 filed on Jul. 10, 2015. The entire contents of each application are hereby incorporated herein by reference.

BACKGROUND OF THE INVENTION

1. Field of the Invention

The present invention relates to a high-frequency module including a multilayer substrate in or on which are provided a first signal path through which an RF signal passes and a second signal path through which an RF signal passes.

2. Description of the Related Art

Thus far, a high-frequency module including high-frequency circuit elements such as switch circuits, duplexers, directional couplers, and the like has been provided. Such a high-frequency module is used as a front-end module connected immediately subsequent to an antenna element, and includes a multilayer substrate 500 such as that illustrated in FIG. 6, for example. FIG. 6 is a diagram illustrating an example of a multilayer substrate included in a past high-frequency module. Here, high-frequency circuit elements such as a directional coupler 501, an inductor 502, a capacitor 503, and a switch circuit transmission line 504 are formed within the multilayer substrate 500 as combinations of internal wiring electrodes such as in-plane conductor patterns and via conductors.

Incidentally, the directional coupler 501 is used, for example, to extract the power of a transmission signal (RF signal) flowing in a main line 501a from a sub line 501b electromagnetically coupled with the main line 501a and monitor that power. There is a risk of the following problem arising in the case where the internal wiring electrodes that form the directional coupler 501 are formed within the multilayer substrate 500 as illustrated in FIG. 6. The internal wiring electrodes that form the directional coupler 501 may electromagnetically couple with the internal wiring electrodes that form the elements aside from the directional coupler 501, such as the inductor 502, the capacitor 503, and the transmission line 504, causing RF signal leakage, interference, and so on. There is also a risk that the characteristics of the directional coupler 501 will vary due to manufacturing variations in the internal wiring electrodes arising when the multilayer substrate 500 is manufactured. Furthermore, because the directional coupler 501 is provided within the multilayer substrate 500, it is difficult to readjust the characteristics of the directional coupler 501 in the case where those characteristics have changed.

SUMMARY OF THE INVENTION

Preferred embodiments of the present invention provide a high-frequency module including a multilayer substrate defining a directional coupler that significantly reduces or prevents interference with other high-frequency circuit elements and whose characteristics are easily adjusted.

A high-frequency module according to a preferred embodiment of the present invention is a high-frequency module including a multilayer substrate in or on which are provided a first signal path through which an RF signal passes and a second signal path through which an RF signal passes, including an internal wiring electrode provided within the first signal path and within the multilayer substrate; and a plurality of land electrodes, provided on a surface of the multilayer substrate, to which is mounted a component including a wiring electrode connected in series to the second signal path. Here, a directional coupler is defined by the internal wiring electrode and the wiring electrode.

According to a preferred embodiment of the present invention, one of a main line and a sub line of the directional coupler is defined by the wiring electrode within the component, and is disposed outside the multilayer substrate. Accordingly, a situation where the directional coupler, defined by the internal wiring electrode and the wiring electrode within the component mounted on the land electrodes of the multilayer substrate, and other high-frequency circuit elements disposed in or on the multilayer substrate interfere with each other is prevented. Additionally, if a plurality of components with different coupling characteristics when the wiring electrode provided therein electromagnetically couples with the internal wiring electrode provided in the multilayer substrate are prepared, it is possible to provide a high-frequency module including a multilayer substrate capable of defining a directional coupler whose characteristics are able to be adjusted with ease simply by selecting the desired component from those components and replacing that component.

The component is preferably an inductor component.

In this case, interference with other high-frequency circuit elements is able to be significantly reduced or prevented, which makes it possible to provide a high-frequency module, having a practical configuration, including a multilayer substrate in and on which a directional coupler whose characteristics are able to be adjusted with ease is provided. In other words, if a plurality of inductor components in which coil electrodes (wiring electrodes) therein have different inductor characteristics are prepared, the high-frequency module including the multilayer substrate capable of defining the directional coupler whose characteristics are able to adjusted with ease is able to be provided simply by selecting the desired inductor component from the inductor components and replacing that inductor component.

Additionally, the component is preferably disposed to overlap the internal wiring electrode directly thereabove when seen in a plan view.

Doing so makes it possible to provide the directional coupler with the wiring electrode within the component and the internal wiring electrode electromagnetically coupling with each other in a reliable manner. Furthermore, because the component is disposed overlapping the internal wiring electrode when seen in a plan view, the surface area of the space where the directional coupler is disposed is able to be reduced, which makes it possible to reduce the size of the high-frequency module.

Additionally, a shape of the internal wiring electrode and a shape of the wiring electrode are preferably set so that a magnetic field produced by the internal wiring electrode and a magnetic field produced by the wiring electrode within the component are oriented in the same direction.

Doing so makes it possible to strengthen the degree of coupling between the internal wiring electrode and the wiring electrode.

Meanwhile, a shape of the internal wiring electrode and a shape of the wiring electrode may be set so that a magnetic field produced by the internal wiring electrode and a magnetic field produced by the wiring electrode within the component are oriented perpendicular or substantially perpendicular to each other.

Doing so makes it possible to weaken the magnetic field coupling between the internal wiring electrode and the wiring electrode, which makes it possible to relatively increase an electric field coupling ratio. This makes it possible to adjust the degree of coupling between the internal wiring electrode and the wiring electrode.

Meanwhile, it is preferable that the internal wiring electrode and the plurality of land electrodes be disposed so as not to overlap when seen in a plan view, a main line of the directional coupler be defined by the internal wiring electrode, and a sub line of the directional coupler be defined by the wiring electrode within the component.

By doing so, a situation where the internal wiring electrode electromagnetically couples with the land electrodes is prevented, and in particular, parasitic capacitance generated between the internal wiring electrode and the land electrodes is able to be reduced. This makes it possible to prevent a situation where the characteristics of the directional coupler vary from design values thereof. Additionally, in the case where an RF signal passes through the internal wiring electrode in a state where the component is not mounted, a situation where the land electrodes and the internal wiring electrode electromagnetically couple and interfere with the RF signal passing through the internal wiring electrode is prevented.

Meanwhile, a sub line of the directional coupler may be defined by the internal wiring electrode and a main line of the directional coupler may be defined by the wiring electrode within the component.

By doing so, a circuit aside from the directional coupler is able to be provided using the component in which the wiring electrode that defines the main line of the directional coupler is provided. This makes it possible to provide a high-frequency module having a high degree of freedom with respect to design.

For example, the component is preferably a component that defines a matching circuit connected to the main line of the directional coupler.

With such a configuration, the component in which the wiring electrode that defines the main line of the directional coupler is provided can also be used as the component that defines the matching circuit; the number of components is therefore able to be reduced, and thus the high-frequency module is able to be made cheaper, simpler, and smaller.

According to various preferred embodiments of the present invention, the component including the wiring electrode is disposed outside the multilayer substrate, and thus a situation where the directional coupler, defined by the internal wiring electrode and the wiring electrode within the component mounted on the land electrodes of the multilayer substrate, and other high-frequency circuit elements disposed in or on the multilayer substrate interfere with each other is prevented. Additionally, if a plurality of components having different coupling characteristics when the wiring electrode defined therein electromagnetically coupled with the internal wiring electrode provided in the multilayer substrate are prepared, it is possible to provide a high-frequency module including a multilayer substrate capable of defining a directional coupler whose characteristics are able to be adjusted with ease simply by selecting the desired component from those components and replacing that component.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 2A is a front view seen from the front of the high-frequency module, FIG. 2B is a plan view seen from above the depiction in FIG. 2A, and FIG. 2C is a diagram illustrating a state in which an inductor component has been removed.

FIG. 5A is a diagram illustrating a case where magnetic fields have the same direction and FIG. 5B is a diagram illustrating a case where the magnetic fields have perpendicular or substantially perpendicular directions.

DETAILED DESCRIPTION OF THE PREFERRED EMBODIMENTS

A high-frequency module according to a preferred embodiment of the present invention will be described with reference to FIGS. 1 and 2A-2C.

Note that FIGS. 1 and 2A-2C illustrate a primary configuration of a preferred embodiment of the present invention, and other components such as signal paths, high-frequency circuit elements, and so on are not shown in order to simplify the descriptions. Like FIG. 1, FIG. 3, which is referred to in another preferred embodiment that will be described later, also illustrates only the primary configuration for the same reason.

Figure 1:
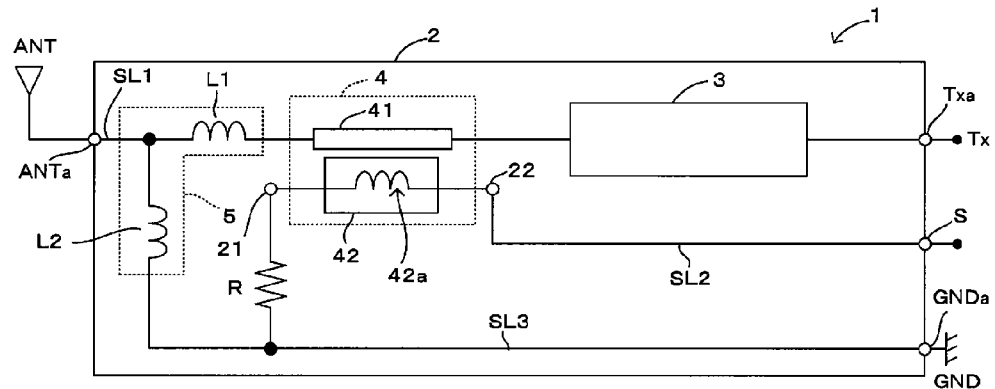
FIG. 1 is a circuit block diagram illustrating a high-frequency module according to a preferred embodiment of the present invention.

A high-frequency module 1 illustrated in FIG. 1 is installed in a motherboard or the like of a mobile communication terminal having communication functionality, such as a cellular phone or a mobile information terminal, and is used as what is known as a front-end module disposed immediately subsequent to an antenna element ANT. In this preferred embodiment, the high-frequency module 1 includes a multilayer substrate 2 in or on which a transmission terminal Txa connected to a transmission path Tx, a shared terminal ANTa connected to the antenna element ANT, a signal terminal S to extract a transmission signal (RF signal) inputted to the transmission terminal Txa, a ground terminal GNDa connected to a ground path GND, a first signal path SL1 connected to the transmission terminal Txa and the shared terminal ANTa, a second signal path SL2 connected to the signal terminal S, and a third path SL3 connected to the ground terminal GNDa are provided. A high-frequency circuit 3, a directional coupler 4, and a matching circuit 5 are provided in the first signal path SL1.

In this preferred embodiment, the module substrate 2 includes a plurality of dielectric layers. A pair of land electrodes 21 and 22 to mount an inductor component 42 that defines the directional coupler 4, land electrodes (not shown) to mount various electronic components that define the high-frequency circuit 3, the matching circuit 5, and the like, and so on are provided in or on the multilayer substrate 2 by providing via conductors and in-plane conductor patterns as appropriate in or on each insulation layer. Additionally, circuit elements such as a capacitor and an inductor may be provided by in-plane conductor patterns and via conductors provided in or on the insulation layers, a filter circuit, the matching circuit 5, and so on may be provided by combining circuit elements such as capacitors and inductors, and so on.

Note that the multilayer substrate 2 may preferably include a printed substrate, an LTCC, an alumina-based substrate, a composite material substrate, or the like using a resin, ceramics, a polymer material, or the like. The multilayer substrate 2 may be formed by selecting the material optimal for the purpose for which the high-frequency module 1 will be used.

The high-frequency circuit 3 includes a filter element for transmission signals, defined by a SAW filter or the like, a matching circuit, and the like, and a transmission signal inputted to the transmission terminal Txa from the transmission path Tx is inputted to the high-frequency circuit 3.

The directional coupler 4 includes an internal wiring electrode 41, provided within the multilayer substrate 2 and inserted into the first signal path SL1 subsequent to the high-frequency circuit 3, and a chip inductor component 42 mounted on the pair of land electrodes 21 and 22 provided on a surface of the multilayer substrate 2. In this preferred embodiment, a main line is defined by the internal wiring electrode 41 and a sub line is defined by a coil electrode 42a within the inductor component 42; the directional coupler 4 in turn is defined by the internal wiring electrode 41 and the coil electrode 42a within the inductor component 42. As such, in this preferred embodiment, a "component" according to a preferred embodiment of the present invention is defined by the inductor component 42, and a "wiring electrode" according to a preferred embodiment of the present invention is defined by the coil electrode 42a within the inductor component 42.

Additionally, the inductor component 42 (the coil electrode 42a) is mounted to the pair of land electrodes 21 and 22 and is thus connected in series to the second signal path SL2. One end of the coil electrode 42a connected to the land electrode 21 is connected to the ground terminal GNDa via the third signal path SL3, with a terminating resistance R at about 50Ω, for example, provided between the stated end and the third signal path SL3. Another end of the coil electrode 42a, connected to the land electrode 22, is connected to the signal terminal S via the second signal path SL2.

Figure 2A:
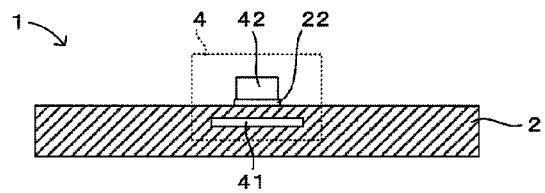
FIGS. 2A-2C are diagrams illustrating a positional relationship of a directional coupler on a multilayer substrate, where
Figure 2B:
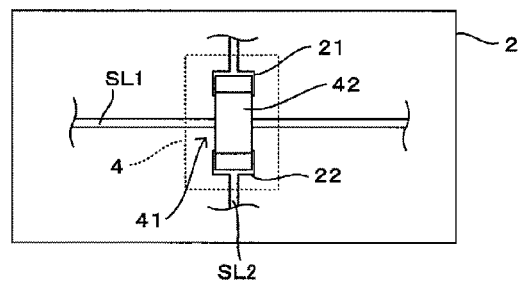
Figure 2C:
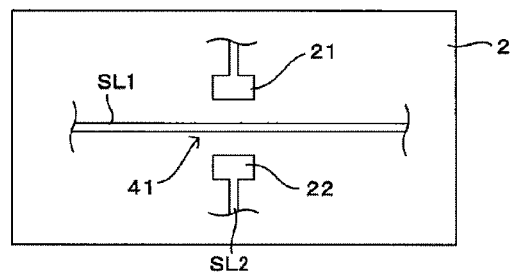

As illustrated in FIGS. 2A and 2B, in this preferred embodiment, the inductor component 42 overlaps the internal wiring electrode 41 directly thereabove when seen in a plan view. Additionally, as illustrated in FIG. 2C, in this preferred embodiment, the internal wiring electrode 41 is disposed so that the internal wiring electrode 41 does not overlap with the pair of land electrodes 21 and 22 when seen in a plan view.

Furthermore, in this preferred embodiment, when the high-frequency module 1 is viewed from the front as illustrated in FIG. 2A, only the pair of land electrodes 21 and 22 is disposed between the internal wiring electrode 41 and the inductor component 42, and other wiring electrodes are not disposed therebetween.

Note that the directional coupler 4 may be connected to the transmission terminal Txa side of the high-frequency circuit 3.

The matching circuit 5 includes an inductor L2, within the first signal path SL1, that is connected to the ground terminal GNDa, and an inductor L1 connected in series between the directional coupler 4 and the shared terminal ANTa. One end of the inductor L2 is connected to the shared terminal ANTa, and another end is connected to the ground terminal GNDa via the third signal path SL3. Meanwhile, one end of the inductor L1 is connected to the shared terminal ANTa, and another end is connected to the internal wiring electrode 41. The inductors L1 and L2 may be provided by combining via conductors, in-plane conductor patterns, and the like within the multilayer substrate 2, or may be provided by mounting chip inductor components on land electrodes provided on the surface of the multilayer substrate 2. Furthermore, the matching circuit 5 may be an LC composite circuit that is a combination of an inductor and a capacitor.

As described thus far, in this preferred embodiment, the inductor component 42 preferably is connected to the second signal path SL2 in series by mounting the inductor component 42 to the pair of land electrodes 21 and 22 provided on the surface of the multilayer substrate 2. The directional coupler 4 is provided by the internal wiring electrode 41 in the first signal path SL1 and within the multilayer substrate 2, and the coil electrode 42a within the inductor component 42. Accordingly, a transmission signal inputted to the transmission terminal Txa is distributed by the directional coupler 4, and is able to be extracted from the signal terminal S via the second signal path SL2.

Additionally, the sub line of the directional coupler 4 is provided by the coil electrode 42a within the inductor component 42 and is disposed outside the multilayer substrate 2. Accordingly, the directional coupler 4 defined by the internal wiring electrode 41 and the coil electrode 42a within the inductor component 42 that is mounted on the pair of land electrodes 21 and 22 of the multilayer substrate 2 is able to significantly reduce or prevent interference with other high-frequency circuit elements disposed in or on the multilayer substrate 2, such as the high-frequency circuit 3 and the matching circuit 5. Additionally, if a plurality of inductor components 42 having different inductor characteristics are prepared, the high-frequency module 1 including the multilayer substrate 2 capable of defining the directional coupler 4 whose characteristics are able to be adjusted with ease is able to be provided simply by selecting the desired inductor component 42 as the inductor component 42 to be mounted on the pair of land electrodes 21 and 22, and replacing that inductor component 42.

Additionally, because the inductor component 42 is disposed directly above the internal wiring electrode 41, the coil electrode 42a within the inductor component 42 and the internal wiring electrode 41 is able to be electromagnetically coupled in a reliable manner to define the directional coupler 4. Furthermore, because the inductor component 42 is disposed to overlap the internal wiring electrode 41 when seen in a plan view, the surface area of the space where the directional coupler 4 is disposed is able to be reduced, which makes it possible to reduce the size of the high-frequency module 1.

Further still, the internal wiring electrode 41 and the pair of land electrodes 21 and 22 are disposed so as not to overlap when seen in a plan view, and thus electromagnetic coupling between the internal wiring electrode 41 and the land electrodes 21 and 22 is significantly reduced or prevented.

Accordingly, a situation where the characteristics of the directional coupler 4 vary from the design values is able to be significantly reduced or prevented. In the case where an RF signal passes through the internal wiring electrode 41 in a state where the inductor component 42 is not mounted, a situation where the land electrodes 21 and 22 and the internal wiring electrode 41 electromagnetically couple and interfere with the RF signal passing through the internal wiring electrode 41 is prevented.

Note that the internal wiring electrode 41 that defines the directional coupler 4 may also be used as a circuit element that defines the matching circuit 5, instead of the serially-connected inductor L1 that defines the matching circuit 5. With such a configuration, the number of components is able to be reduced, and thus the high-frequency module 1 is able to be made cheaper, simpler, and smaller.

Other Preferred Embodiments

Figure 3:
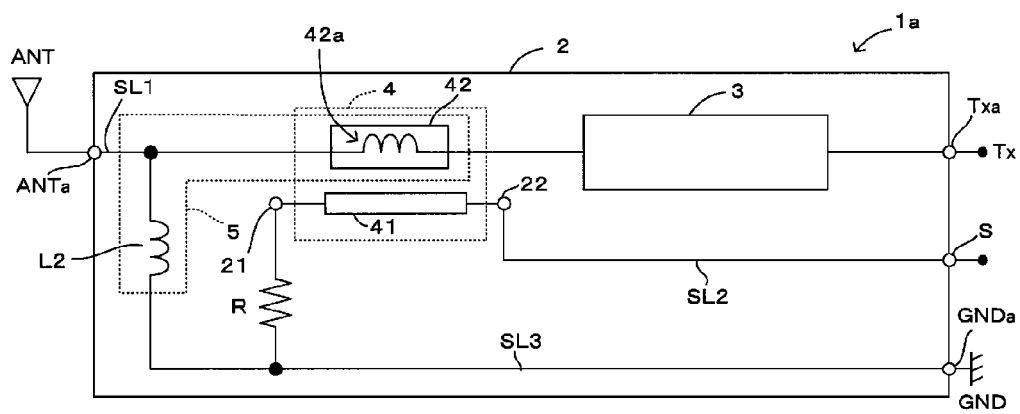
FIG. 3 is a circuit block diagram illustrating a high-frequency module according to another preferred embodiment of the present invention.

A high-frequency module according to another preferred embodiment of the present invention will be described with reference to FIG. 3. FIG. 3 is a circuit block diagram illustrating a high-frequency module according to another preferred embodiment of the present invention.

A high-frequency module 1a according to this preferred embodiment differs from the high-frequency module 1 according to the first preferred embodiment described above in that the inductor component 42 is a component that defines the matching circuit 5, as illustrated in FIG. 3. In other words, the inductor component 42 to define the directional coupler 4 also defines and functions as the inductor component 42 of the matching circuit 5. Additionally, a sub line of the directional coupler 4 is defined by the internal wiring electrode 41, and a main line of the directional coupler is defined by the coil electrode 42a within the inductor component 42. Other configurations are the same as in the preferred embodiments described above, and thus the same reference signs will be used and descriptions of those configurations will be omitted.

With such a configuration, the number of components is able to be reduced, and thus the high-frequency module 1a is able to be made cheaper, simpler, and smaller.

Additionally, the following effects are able to be achieved by using the chip inductor component 42, which includes the coil electrode 42a, to define the main line of the directional coupler 4. As such, using a chip inductor component 42, and particularly using an inductor component 42 having a high Q value, makes it possible to reduce resistance in the main line of the directional coupler 4, which in turn makes it possible to reduce loss in the transmission signal passing through the main line.

Examples of the coil electrode 42a provided within the inductor component 42 and the coil electrode defined by the internal wiring electrode 41 will be described with reference to FIGS. 4A-4F. FIGS. 4A-4F include diagrams illustrating examples of the coil electrodes, each of FIGS. 4A to 4F illustrating different coil electrodes. Note that the coil electrodes described below are provided in or on respective insulation layers that define the inductor component 42, respective insulation layers that define the multilayer substrate 2, and so on, and the directional coupler 4 may be provided by combining the coil electrodes described hereinafter in any manner in accordance with the required characteristics of the directional coupler 4.

Figure 4A:
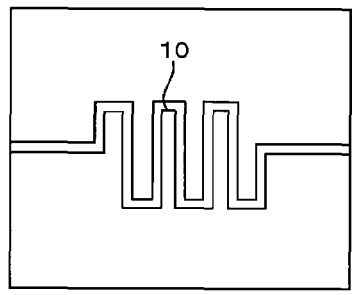
FIGS. 4A to 4F are diagrams illustrating examples of coil electrodes, each of FIGS. 4A to 4F illustrating different coil electrodes.
Figure 4B:
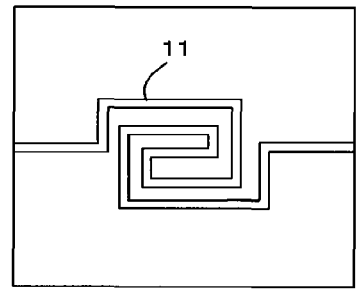
Figure 4C:
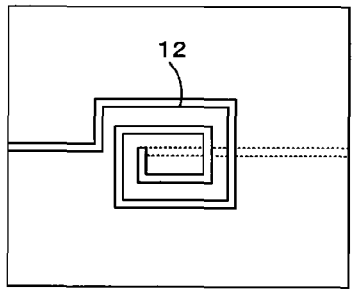
Figure 4D:
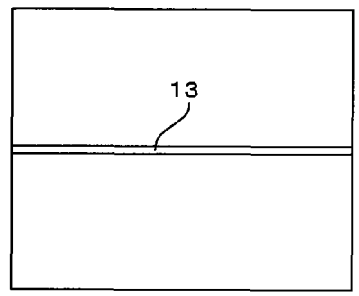

A coil electrode 10 illustrated in FIG. 4A preferably has a meandering shape, whereas a coil electrode 11 illustrated in FIG. 4B preferably has a spiral shape. A coil electrode 12 illustrated in FIG. 4C preferably has a spiral shape, with one extended electrode (indicated by a dotted line area in FIG. 4C) provided on a different insulation layer than the main portion of the coil electrode 12 and connected to the main portion of the coil electrode 12 by a via conductor. A coil electrode 13 illustrated in FIG. 4D preferably has a straight line shape.

Figure 4E:
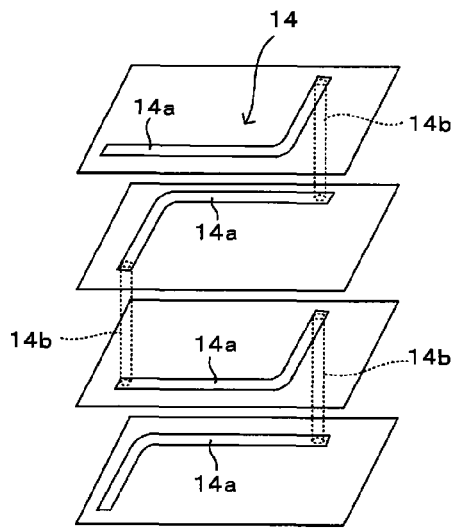

A coil electrode 14 illustrated in FIG. 4E includes a plurality of L-shaped or substantially L-shaped in-plane conductor patterns 14a provided on respective insulation layers. The substantially L-shaped in-plane conductor patterns 14a in the first and third layers from the top are oriented in the same direction, whereas the L-shaped or substantially L-shaped in-plane conductor patterns 14a in the second and fourth layers from the top are oriented in directions rotated approximately 180° relative to the in-plane conductor patterns 14a in the first and third layers. One end on the short side of the in-plane conductor pattern 14a in the first layer and another end on the long side of the in-plane conductor pattern 14a in the second layer are connected by a via conductor 14b, one end on the short side of the in-plane conductor pattern 14a in the second layer and another end on the long side of the in-plane conductor pattern 14a in the third layer are connected by a via conductor 14b, and one end on the short side of the third layer and another end on the long side of the in-plane conductor pattern 14a in the fourth layer are connected by a via conductor 14b. A spiral-shaped coil electrode 14 is provided as a result.

Figure 4F:
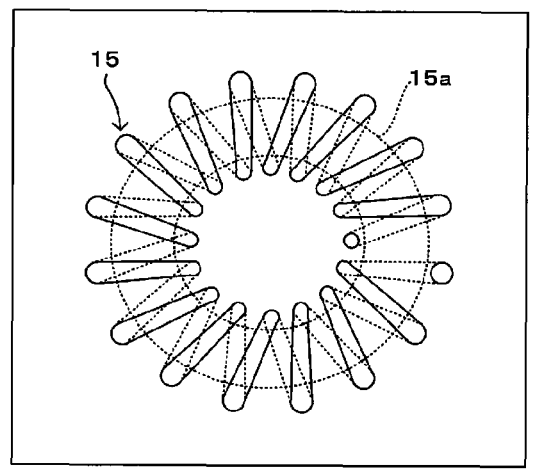

A coil electrode 15 illustrated in FIG. 4F is formed preferably by winding the periphery of an annular toroidal coil core 15a in a spiral shape.

Figure 5A:
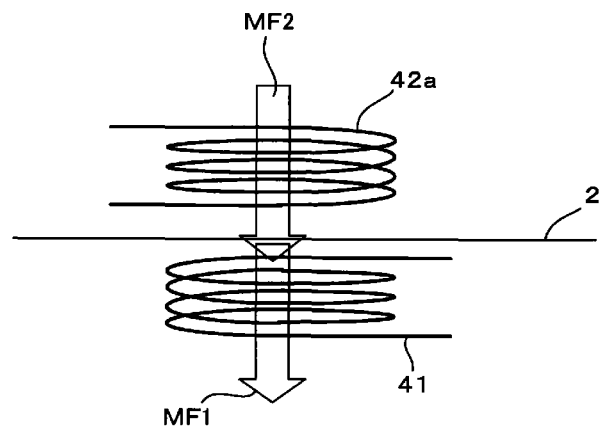
FIGS. 5A and 5B are schematic diagrams illustrating directions of magnetic fields, where
Figure 5B:
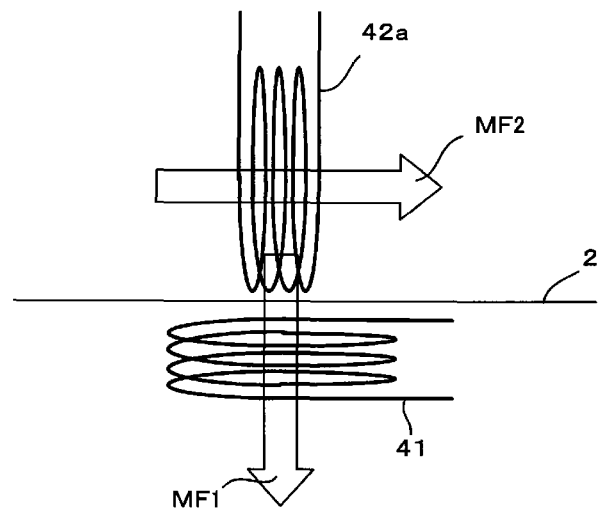
Figure 6:
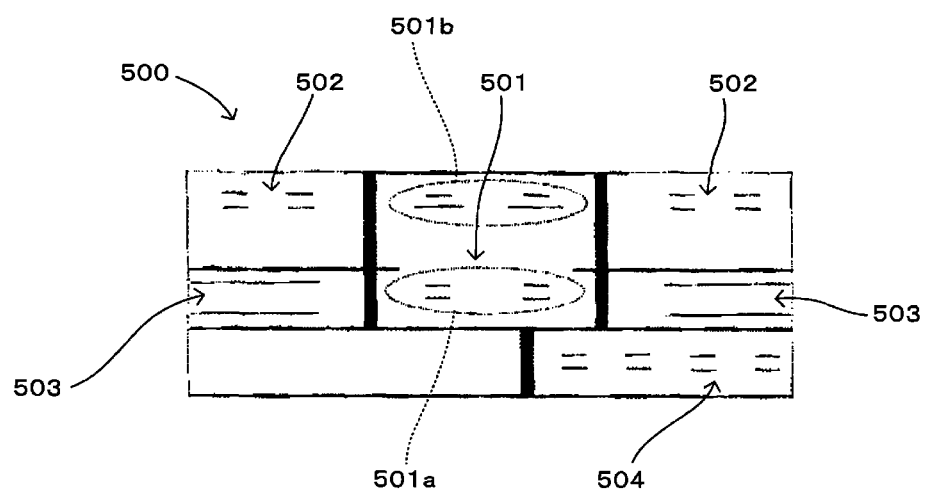
FIG. 6 is a diagram illustrating a multilayer substrate included in a past high-frequency module.

The directions of magnetic fields in the coil electrode 42a provided within the inductor component 42 and the coil electrode defined by the internal wiring electrode 41 will be described with reference to FIGS. 5A and 5B. FIGS. 5A and 5B are schematic diagrams illustrating directions of magnetic fields, where FIG. 5A is a diagram illustrating a case where magnetic fields have the same direction and FIG. 5B is a diagram illustrating a case where the magnetic fields have perpendicular or substantially perpendicular directions.

As illustrated in FIG. 5A, setting the shapes of the internal wiring electrode 41 and the coil electrode 42a so that a magnetic field MF1 produced by the internal wiring electrode 41 and a magnetic field MF2 produced by the coil electrode 42a within the inductor component 42 are oriented in the same direction makes it possible to strengthen the degree of coupling between the internal wiring electrode 41 and the coil electrode 42a.

As illustrated in FIG. 5B, setting the shapes of the internal wiring electrode 41 and the coil electrode 42a so that the magnetic field MF1 produced by the internal wiring electrode 41 and the magnetic field MF2 produced by the coil electrode 42a within the inductor component 42 are oriented perpendicular or substantially perpendicular to each other makes it possible to suppress electromagnetic coupling between the coil electrode 42a and inductors included in other high-frequency circuit elements provided within the multilayer substrate 2. Note that the degree of coupling between the internal wiring electrode 41 and the coil electrode 42a can be weakened not only in the case where the magnetic field MF1 produced by the internal wiring electrode 41 and the magnetic field MF2 produced by the coil electrode 42a within the inductor component 42 are oriented perpendicular or substantially perpendicular to each other, but also in the case where the shapes of the internal wiring electrode 41 and the coil electrode 42a are set so that the magnetic field MF1 and the magnetic field MF2 are oriented in different directions.

Accordingly, the degree of coupling between the main line and the sub line that define the directional coupler 4 is able to be adjusted by adjusting orientations of the magnetic fields MF1 and MF2 as described above in accordance with the required characteristics of the directional coupler 4. Additionally, the directional coupler 4 may be defined by any combination of the above-described orientations of the magnetic fields MF1 and MF2 and the coil electrodes 10 to 15 described with reference to FIGS. 4A to 4F.

Note that the present invention is not intended to be limited to the aforementioned preferred embodiments, and many variations aside from the content described above can be made without departing from the essential spirit of the present invention; furthermore, the configurations provided in the aforementioned preferred embodiments may be combined in any way. For example, it is not absolutely necessary that the inductor component 42 be disposed directly above the internal wiring electrode 41, and the degree of coupling between the main line and the sub line of the directional coupler 4 is able to be adjusted with ease by shifting the mounting position of the inductor component 42.

Additionally, another sub line may be connected in series to the signal terminal S side of the sub line of the directional coupler 4. By changing the line widths, line shapes, and so on in a plurality of sub lines, the impedance of the sub lines is able to be changed, the degree of coupling with the main line is able to be adjusted, and so on.

Meanwhile, the internal wiring electrode 41 and the coil electrode 42a electromagnetically coupling refers to a state in which the internal wiring electrode 41 and the coil electrode 42a couple with each other through the electromagnetic field. The position of the inductor component 42 relative to the internal wiring electrode 41 may be adjusted, an inductance value of the coil electrode 42a of the inductor component 42 may be adjusted, and so on in order for the directional coupler 4 to achieve the desired degree of coupling.

Additionally, although the directional coupler 4 preferably includes a chip inductor component 42 in the above-described preferred embodiments, the component that defines the directional coupler 4 is not limited to the inductor component 42; the directional coupler 4 may be defined by any component as long as the component includes a wiring electrode connected to the land electrodes 21 and 22. For example, the component may be a component having low-pass filter functionality, including an inductor (wiring electrode) connected in series between the land electrodes 21 and 22 and a plurality of capacitors connected at one end to one of the ends of the inductor and grounded at the other ends. Alternatively, the component may be a component simply including a wiring electrode to connect to the land electrodes 21 and 22, for example.

Preferred embodiments of the present invention are able to be applied broadly in high-frequency modules including a multilayer substrate in or on which are provided a first signal path through which an RF signal passes and a second signal path through which an RF signal passes.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high-frequency module comprising:
a multilayer substrate in or on which are provided a first signal path through which an RF signal passes and a second signal path through which an RF signal passes;
an internal wiring electrode provided within the first signal path and within the multilayer substrate; and
a plurality of land electrodes, provided on a surface of the multilayer substrate, to which is mounted a component including a wiring electrode connected in series to the second signal path; wherein
a directional coupler is defined by the internal wiring electrode and the wiring electrode.

2. The high-frequency module according to claim 1, wherein the component is an inductor component.

3. The high-frequency module according to claim 1, wherein the component is overlaps the internal wiring electrode directly thereabove when seen in a plan view.

4. The high-frequency module according to claim 1, wherein a shape of the internal wiring electrode and a shape of the wiring electrode cause a magnetic field produced by the internal wiring electrode and a magnetic field produced by the wiring electrode within the component to be oriented in a same direction.

5. The high-frequency module according to claim 1, wherein a shape of the internal wiring electrode and a shape of the wiring electrode cause a magnetic field produced by the internal wiring electrode and a magnetic field produced by the wiring electrode within the component to be perpendicular or substantially perpendicular to each other.

6. The high-frequency module according to claim 1, wherein
the internal wiring electrode and the plurality of land electrodes do not overlap when seen in a plan view; and
a main line of the directional coupler is defined by the internal wiring electrode and a sub line of the directional coupler is defined by the wiring electrode within the component.

7. The high-frequency module according to claim 1, wherein a sub line of the directional coupler is defined by the internal wiring electrode and a main line of the directional coupler is defined by the wiring electrode within the component.

8. The high-frequency module according to claim 7, wherein the component defines a matching circuit connected to the main line of the directional coupler.

9. The high-frequency module according to claim 1, wherein the first signal path includes a high-frequency circuit, a directional coupler, and a matching circuit.

10. The high-frequency module according to claim 9, wherein the matching circuit includes a first inductor within the first signal path and connected to a ground terminal, and a second inductor connected in series between the directional coupler and a shared antenna terminal.

11. The high-frequency module according to claim 10, wherein the first inductor and the second inductor are defined by at least one of via conductors, in-plane conductor patterns, and chip inductor components.

12. The high-frequency module according to claim 9, wherein the matching circuit is an LC composite circuit including an inductor and a capacitor.

13. The high-frequency module according to claim 9, wherein the internal wiring electrode defines the directional coupler and defines the matching circuit.

14. The high-frequency module according to claim 9, wherein the component is an inductor component and the inductor component defines the matching circuit.

15. The high-frequency module according to claim 1, wherein the high-frequency module is a front end module.

16. The high-frequency module according to claim 1, wherein the multilayer substrate includes a plurality of insulation layers, and via conductors and in-plane conductor patterns in or on each of the insulation layers.

17. The high-frequency module according to claim 16, wherein the via conductors and the in-plane conductor patterns define circuit elements including at least one of a capacitor and an inductor.

18. The high-frequency module according to claim 1, wherein the component includes a coil electrode that is electromagnetically coupled to the internal wiring electrode.

19. A mobile communication terminal comprising:
the high-frequency module according to claim 1; and
an antenna connected to the high-frequency module.

20. The mobile communication terminal according to claim 19, wherein the mobile communication terminal is one of a cellular phone and a mobile information terminal.

* * * * *